United States Patent
Tanaka et al.

(10) Patent No.: US 10,843,223 B2
(45) Date of Patent: Nov. 24, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventors: Takayoshi Tanaka, Kyoto (JP); Tetsuya Emoto, Kyoto (JP); Akira Oato, Kyoto (JP); Yuta Nakano, Kyoto (JP); Teppei Nakano, Kyoto (JP); Takashi Akiyama, Kyoto (JP); Yuya Tsuchihashi, Kyoto (JP); Reo Tamura, Kyoto (JP); Atsuro Eitoku, Kyoto (JP); Tomomi Iwata, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 97 days.

(21) Appl. No.: 15/992,250

(22) Filed: May 30, 2018

(65) Prior Publication Data
US 2018/0345315 A1    Dec. 6, 2018

(30) Foreign Application Priority Data

May 31, 2017    (JP) .................................. 2017-108184

(51) Int. Cl.
*B05D 1/00* (2006.01)
*B08B 3/08* (2006.01)
(Continued)

(52) U.S. Cl.
CPC ................ *B05D 1/005* (2013.01); *B05B 1/30* (2013.01); *B08B 3/08* (2013.01);
(Continued)

(58) Field of Classification Search
CPC ................... H01L 21/02041; H01L 21/02057
See application file for complete search history.

(56) References Cited

U.S. PATENT DOCUMENTS

| | | | |
|---|---|---|---|
| 2012/0045581 A1 | 2/2012 | Kimura et al. | 427/248.1 |
| 2014/0065295 A1 | 3/2014 | Emoto et al. | 427/8 |
| 2016/0346795 A1 | 12/2016 | Choi et al. | |

FOREIGN PATENT DOCUMENTS

| | | |
|---|---|---|
| KR | 10-2012-0022632 A | 3/2012 |
| KR | 10-2017-0038184 A | 4/2017 |
| TW | 200535998 A | 11/2005 |

OTHER PUBLICATIONS

KR20170038184; Kang et al.; machine translation (Year: 2017).*

* cited by examiner

*Primary Examiner* — Mikhail Kornakov
*Assistant Examiner* — Natasha N Campbell
(74) *Attorney, Agent, or Firm* — Ostrolenk Faber LLP (57) ABSTRACT

A substrate processing method includes a rinse liquid supplying step of supplying a rinse liquid containing water to a major surface of a substrate, a rotating step of rotating the substrate around a rotation axis passing through a central portion of the major surface of the substrate, and a hydrophobizing agent supplying step of supplying a hydrophobizing agent containing a first dissolving agent to the major surface of the substrate to replace a liquid held on the major surface of the substrate with the hydrophobizing agent in parallel with the rotating step after the rinse liquid supplying step is performed, and the hydrophobizing agent supplying step includes a hydrophobizing agent discharging step of discharging a continuous flow of the hydrophobizing agent from a discharge port of a nozzle toward the major surface of the substrate held by a substrate holding unit with a Reynolds number at the discharge port being not more than 1500.

2 Claims, 8 Drawing Sheets

(51) Int. Cl.
*B05B 1/30* (2006.01)
*H01L 21/02* (2006.01)
*H01L 21/67* (2006.01)
(52) U.S. Cl.
CPC .... *H01L 21/02057* (2013.01); *H01L 21/6715* (2013.01); *H01L 21/67028* (2013.01); *H01L 21/67051* (2013.01)

| SMT type | SMT flow rate (ml/min) | | | | | |
|---|---|---|---|---|---|---|
| | 80 | 120 | 150 | 170 | 200 | 300 |
| SMT1 | ○ | ○ | ○ | — | × | × |
| SMT2 | ○ | ○ | × | — | × | × |
| SMT3 | ○ | — | ○ | △ | × | × |

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus that process a major surface of a substrate. Examples of substrates subject to processing include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, substrates for solar cells, etc.

2. Description of Related Art

In a manufacturing process for a semiconductor device or a liquid crystal display device, a substrate, such as a semiconductor wafer or a glass substrate for liquid crystal display device, etc., is processed, for example, one by one. Specifically, a chemical liquid is supplied to the substrate to process a major surface of the substrate by the chemical liquid. Thereafter, the chemical liquid attached to the substrate is rinsed off by supplying pure water to the substrate. After the chemical liquid is rinsed off, IPA (isopropyl alcohol), which is lower in boiling point than water, is supplied to the substrate and the pure water attached to the substrate is replaced by the IPA. Thereafter, the IPA attached to the substrate is removed from the substrate and the substrate is dried by rotating the substrate at high speed.

However, with such a substrate processing method, there are cases where a pattern formed on the major surface of the substrate collapses when the substrate is being dried. A method where the major surface of the substrate is dried after being hydrophobized to prevent pattern collapse is thus disclosed in US Patent Application No. 2014/065295 A1.

Specifically, a hydrophobizing agent is discharged toward an upper surface of the substrate from a nozzle to supply the hydrophobizing agent to the upper surface of the substrate and a liquid film of the hydrophobizing agent that covers the entire upper surface is thereby formed on the upper surface of the substrate. The upper surface of the substrate is thereby hydrophobized. Thereafter, IPA is supplied to the substrate and the hydrophobizing agent held on the upper surface of the substrate is replaced by the IPA. After the hydrophobizing agent is replaced by the IPA, pure water is supplied to the substrate to replace the IPA held on the upper surface of the substrate with the pure water. Thereafter, the substrate is dried by rotating the substrate at high speed.

SUMMARY OF THE INVENTION

Time required from the start of discharge of the hydrophobizing agent to coverage of the entire upper surface of the substrate by the hydrophobizing agent (forming of the liquid film covering the entire upper surface of the substrate) is preferably short. This is from a standpoint of improving throughput and a standpoint of saving the hydrophobizing agent. To shorten the time required from the start of discharge of the hydrophobizing agent to coverage, it is preferably for a discharge flow rate of the hydrophobizing agent to be sufficiently large.

However, when the hydrophobizing agent is discharged from the nozzle at a large flow rate, the discharge may become turbulent. When the discharge becomes turbulent, vibration is generated at the upper surface of the substrate due to an impact force when the hydrophobizing agent lands on the upper surface of the substrate and this vibration is transmitted to the hydrophobizing agent held on the upper surface of the substrate. Consequently, rippling occurs in the hydrophobizing agent held on the upper surface.

When rippling occurs in the hydrophobizing agent held on the upper surface of the substrate, a contact area of the hydrophobizing agent and moisture in the surrounding atmosphere increases. The hydrophobizing agent reacts readily with water and will also react with the moisture in the atmosphere. By reaction with the moisture in the atmosphere, a hydrophobizing ability of the hydrophobizing agent held on the upper surface of the substrate decreases. Consequently, there are cases where the major surface (upper surface) of the substrate cannot be hydrophobization processed satisfactorily.

Therefore, an object of the present invention is to provide a substrate processing method and a substrate processing apparatus capable of suppressing or preventing turbulence of discharge of a hydrophobizing agent supplied to a major surface of a substrate and thereby hydrophobization processing the major surface of the substrate satisfactorily.

The present invention provides a substrate processing method including a rinse liquid supplying step of supplying a rinse liquid containing water to a major surface of a substrate, a rotating process of rotating the substrate around a rotation axis passing through a central portion of the major surface of the substrate, and a hydrophobizing agent supplying step of supplying a hydrophobizing agent containing a first dissolving agent to the major surface of the substrate to replace a liquid held on the major surface of the substrate with the hydrophobizing agent in parallel with the rotating step after the rinse liquid supplying step is performed, and the hydrophobizing agent supplying step includes a hydrophobizing agent discharging step of discharging a continuous flow of the hydrophobizing agent from a discharge port of a nozzle toward the major surface of the substrate held by a substrate holding unit with a Reynolds number at the discharge port being not more than 1500.

With the present method, the rinse liquid is supplied to the major surface of the substrate. Thereafter, the continuous flow of the hydrophobizing agent is discharged from the discharge port of the nozzle toward the major surface of the substrate with the Reynolds number at the discharge port being not more than 1500. If the Reynolds number is not more than 1500, the hydrophobizing agent, containing the first dissolving agent and being of continuous flow form discharged from the discharge port, takes on a columnar form without becoming turbulent. That is, turbulence of discharge does not occur or is low even if it occurs. Turbulence of discharge of the hydrophobizing agent supplied to the major surface of the substrate can thus be suppressed or prevented. Occurrence of rippling of the hydrophobizing agent supplied to the major surface (held on the major surface) of the substrate can thereby be suppressed or prevented and consequently, a contact area of the hydrophobizing agent and moisture in atmosphere can be suppressed to be small. The major surface of the substrate can thus be hydrophobization processed satisfactorily.

In a preferred embodiment of the present invention, the method further includes a second dissolving agent supplying step of supplying a second dissolving agent, differing in type from the first dissolving agent, to the major surface of the substrate to replace a liquid held on the major surface of the substrate with the second dissolving agent at a point after the rinse liquid supplying step is performed and before the hydrophobizing agent supplying step is performed, and a first dissolving agent supplying step of supplying the first dissolving agent to the major surface of the substrate to replace a liquid held on the major surface of the substrate with the first dissolving agent in parallel with the rotating step at a point after the second dissolving agent supplying step is performed and before the hydrophobizing agent supplying step is performed.

With the present method, after the rinse liquid is supplied to the major surface of the substrate, the second dissolving agent, differing in type from the first dissolving agent, is supplied to the major surface of the substrate. The rinse liquid is thereby removed from the substrate. Also, after the second dissolving agent is supplied to the major surface of the substrate, the first dissolving agent is supplied to the upper surface of the substrate. The second dissolving agent held on the major surface of the substrate is thereby replaced by the first dissolving agent. And, after the first dissolving agent is supplied, the hydrophobizing agent containing the first dissolving agent is supplied to the major surface of the substrate. The first dissolving agent held on the major surface of the substrate is thereby replaced by the hydrophobizing agent containing the same first dissolving agent.

The hydrophobizing agent containing the first dissolving agent is high in affinity with and easily replaces the same first dissolving agent. On the other hand, depending on the types of the first dissolving agent and the second dissolving agent, the hydrophobizing agent containing the first dissolving agent may be low in affinity with and have difficulty replacing the second dissolving agent (replacement may be difficult due to a difference in viscosity between the hydrophobizing agent and the second dissolving agent). Therefore, in comparison to a case of replacing the second dissolving agent of different type with the hydrophobizing agent containing the first dissolving agent, replacement can be achieved more smoothly by replacing the same first dissolving agent with the hydrophobizing agent containing the first dissolving agent. A liquid film of the hydrophobizing agent can thereby be formed more easily on the major surface of the substrate.

The present invention provides a substrate processing apparatus including a substrate holding unit, holding a substrate, a rotating unit, rotating the substrate held by the substrate holding unit around a rotation axis passing through a central portion of a major surface of the substrate, a rinse liquid supplying unit, supplying a rinse liquid containing water to the substrate held by the substrate holding unit, a hydrophobizing agent supplying unit, having a nozzle having a discharge port and supplying a hydrophobizing agent containing a first dissolving agent to the substrate held by the substrate holding unit, and a controller arranged to control rotating unit, the rinse liquid supplying unit, and the hydrophobizing agent supplying unit, the controller executes a rinse liquid supplying step of supplying the rinse liquid to the major surface of the substrate by the rinse liquid supplying unit, a rotating step of rotating the substrate around the rotation axis passing through the central portion of the major surface of the substrate by the rotating unit, and a hydrophobizing agent supplying step of controlling the hydrophobizing agent supplying unit to supply the hydrophobizing agent containing the first dissolving agent to the major surface of the substrate by the hydrophobizing agent supplying unit to replace a liquid held on the major surface of the substrate with the hydrophobizing agent in parallel with the rotating step after the rinse liquid supplying step is performed, and in the hydrophobizing agent supplying step, the controller executes a hydrophobizing agent discharging step of discharging a continuous flow of the hydrophobizing agent from the discharge port of the nozzle toward the major surface of the substrate held by the substrate holding unit with a Reynolds number at the discharge port being not more than 1500.

With the present arrangement, the rinse liquid is supplied to the major surface of the substrate. Thereafter, the continuous flow of the hydrophobizing agent is discharged from the discharge port of the nozzle toward the major surface of the substrate with the Reynolds number at the discharge port being not more than 1500. If the Reynolds number is not more than 1500, the hydrophobizing agent, containing the first dissolving agent and being of continuous flow form discharged from the discharge port, takes on a columnar form without becoming turbulent. That is, turbulence of discharge does not occur or is low even if it occurs. Turbulence of discharge of the hydrophobizing agent supplied to the major surface of the substrate can thus be suppressed or prevented. Occurrence of rippling of the hydrophobizing agent supplied to the major surface (held on the major surface) of the substrate can thereby be suppressed or prevented and consequently, the contact area of the hydrophobizing agent and the moisture in the atmosphere can be suppressed to be small. The major surface of the substrate can thus be hydrophobization processed satisfactorily.

In the preferred embodiment of the present invention, the apparatus further includes a second dissolving agent supplying unit, supplying a second dissolving agent, differing in type from the first dissolving agent, to the substrate held by the substrate holding unit, and a first dissolving agent supplying unit, supplying the first dissolving agent to the substrate held by the substrate holding unit. In this case, the controller is arranged further to control the first dissolving agent supplying unit and the second dissolving agent supplying unit. In this case, the controller executes a second dissolving agent supplying step of supplying the second dissolving agent to the major surface of the substrate by the second dissolving agent supplying unit to replace a liquid held on the major surface of the substrate with the second dissolving agent at a point after the rinse liquid supplying step is performed and before the hydrophobizing agent supplying step is performed, and a first dissolving agent supplying step of supplying the first dissolving agent to the major surface of the substrate by the first dissolving agent supplying unit to replace a liquid held on the major surface of the substrate with the first dissolving agent in parallel with the rotating step at a point after the second dissolving agent supplying step is performed and before the hydrophobizing agent supplying step is performed.

With the present arrangement, after the rinse liquid is supplied to the major surface of the substrate, the second dissolving agent, differing in type from the first dissolving agent, is supplied to the major surface of the substrate. The rinse liquid is thereby removed from the substrate. Also, after the second dissolving agent is supplied to the major surface of the substrate, the first dissolving agent is supplied to the upper surface of the substrate before the hydrophobizing agent is supplied to the major surface of the substrate. The second dissolving agent held on the major surface of the substrate is thereby replaced by the first dissolving agent. And, after the first dissolving agent is supplied, the hydrophobizing agent containing the first dissolving agent is supplied to the major surface of the substrate. The first dissolving agent held on the major surface of the substrate is thereby replaced by the hydrophobizing agent containing the same first dissolving agent.

The hydrophobizing agent containing the first dissolving agent is high in affinity with and easily replaces the same first dissolving agent. On the other hand, depending on the type of the second dissolving agent, the hydrophobizing agent containing the first dissolving agent may be low in affinity with and have difficulty replacing the second dissolving agent (replacement may be difficult due to a difference in viscosity between the hydrophobizing agent and the second dissolving agent). Therefore, in comparison to a case of replacing the second dissolving agent of different type with the hydrophobizing agent containing the first dissolving agent, replacement can be achieved more smoothly by replacing the same first dissolving agent with the hydrophobizing agent containing the first dissolving agent. The liquid film of the hydrophobizing agent can thereby be formed more easily on the major surface of the substrate.

The above and other objects, features, and effects of the present invention will become more apparent from the following detailed description of the preferred embodiment with reference to the attached drawings.

DETAILED DESCRIPTION OF PREFERRED EMBODIMENTS

Figure 1:
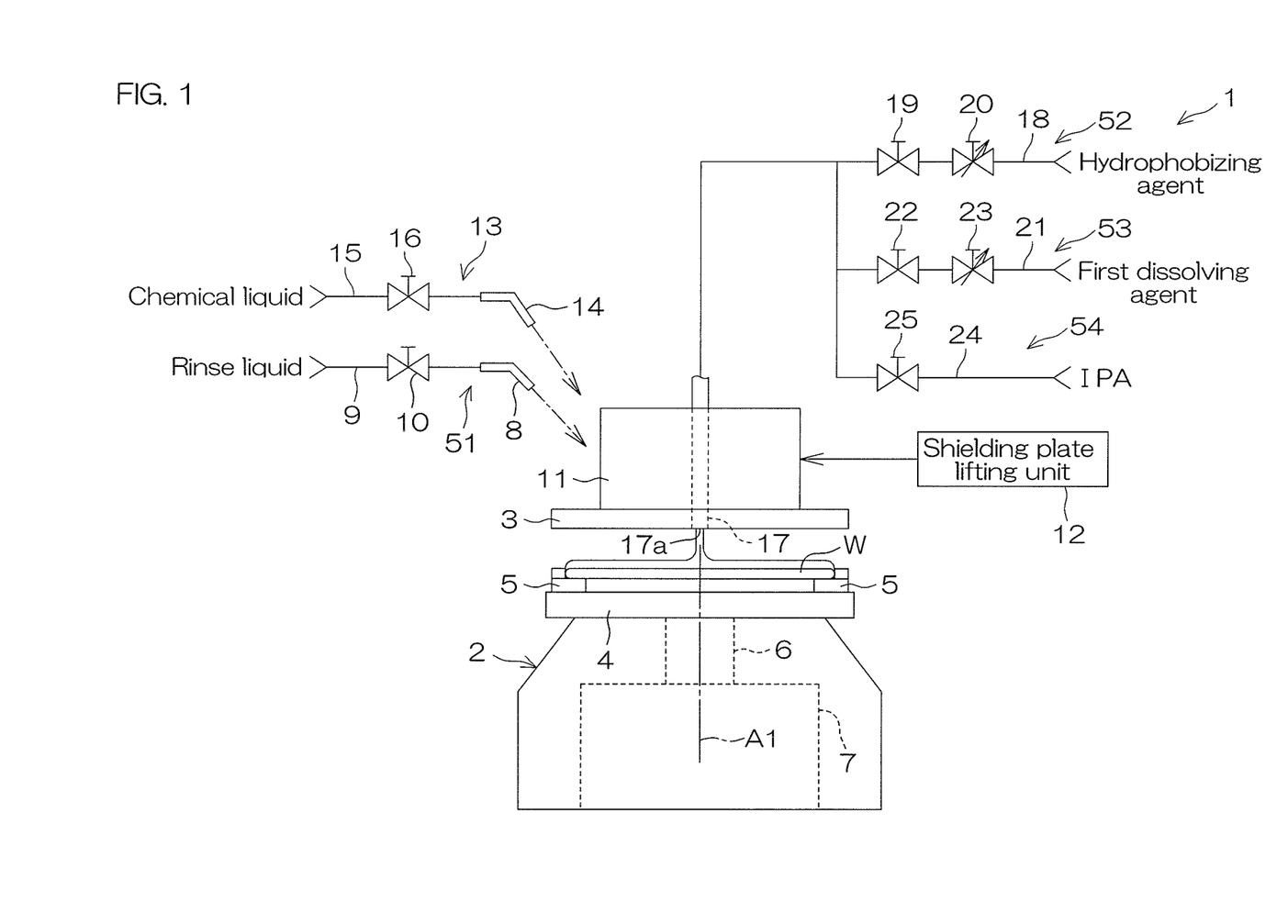
FIG. 1 is a view, viewed from a horizontal direction, of a substrate processing apparatus according to a preferred embodiment of the present invention.

FIG. 1 is a view, viewed from a horizontal direction, of a substrate processing apparatus 1 according to a preferred embodiment of the present invention. The substrate processing apparatus 1 is a single substrate processing type apparatus that uses processing liquids (a chemical liquid and a rinse liquid, etc.) to process a disk-shaped substrate W, such as a semiconductor wafer, etc., one by one. The substrate processing apparatus 1 includes a spin chuck (substrate holing unit) 2 that rotates the substrate W around a vertical rotation axis A1 passing through a central portion of the substrate W while holding the substrate W horizontally, a processing liquid supplying unit, supplying the processing liquids to the substrate W held by the spin chuck 2, and a shielding plate 3, disposed above the spin chuck 2.

The spin chuck 2 includes a disk-shaped spin base 4 that is held in a horizontal orientation, a plurality of clamp pins 5 that hold the substrate W in a horizontal orientation above the spin base 4, a spin shaft 6 that extends downward from a central portion of the spin base 4, and a spin motor (rotating unit) 7 that rotates the spin shaft 6 to rotate the substrate W and the spin base 4 around the rotation axis A1. The spin chuck 2 is not restricted to a clamping type chuck, with which the plurality of clamp pins 5 are put in contact with an peripheral end surface of the substrate W, and may be a vacuum type chuck with which a rear surface (lower surface) of the substrate W that is a non-device forming surface is suctioned onto an upper surface of the spin base 4 to hold the substrate W horizontally.

The processing liquid supplying unit includes a chemical liquid supplying unit 13 that supplies the chemical liquid to the substrate W held by the spin chuck 2. The chemical liquid supplying unit 13 includes a chemical liquid nozzle 14, discharging the chemical liquid downward toward an upper surface of the substrate W held by the spin chuck 2, a chemical liquid line 15, guiding the chemical liquid from a chemical liquid supply source to the chemical liquid nozzle 14, and a chemical liquid valve 16, opening and closing the chemical liquid line 15. The chemical liquid may be a liquid containing, for example, at least one of sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH: tetramethylammonium hydroxide, etc.), a surfactant, and a corrosion inhibitor. When the chemical liquid valve 16 is opened, the chemical liquid is supplied to the chemical liquid nozzle 14 from the chemical liquid line 15. When the chemical liquid valve 16 is closed, the supply of the chemical liquid from the chemical liquid line 15 to the chemical liquid nozzle 14 is stopped. A chemical liquid nozzle moving apparatus, which, by moving the chemical liquid nozzle 14, moves a liquid landing position of the chemical liquid with respect to the upper surface of the substrate W, between a central portion of the upper surface of the substrate W and a portion besides that (for example, a peripheral edge portion), may be included.

The processing liquid supplying unit includes a rinse liquid supplying unit 51 that supplies the rinse liquid to the substrate W held by the spin chuck 2. The rinse liquid supplying unit 51 includes a rinse liquid nozzle 8, discharging the rinse liquid downward toward the upper surface of the substrate W held by the spin chuck 2, a rinse liquid line 9, guiding the rinse liquid from a rinse liquid supply source to the rinse liquid nozzle 8, and a rinse liquid valve 10, opening and closing the rinse liquid line 9. The rinse liquid is, for example, pure water (deionized water). When the rinse liquid valve 10 is opened, the rinse liquid is supplied toward the rinse liquid nozzle 8 from the rinse liquid line 9. When the rinse liquid valve 10 is closed, the supply of the rinse liquid from the rinse liquid line 9 to the rinse liquid nozzle 8 is stopped. The rinse liquid is not restricted to pure water and may be any of carbonated water, electrolyzed ion water, hydrogen water, ozone water, and aqueous hydrochloric acid solution of dilute concentration (of, for example, approximately 10 to 100 ppm). A rinse liquid nozzle moving apparatus, which, by moving the rinse liquid nozzle 8, moves a liquid landing position of the rinse liquid with respect to the upper surface of the substrate W, between the central portion of the upper surface of the substrate W and a portion besides that (for example, the peripheral edge portion), may be included.

The shielding plate 3 is, for example, disk-shaped. A diameter of the shielding plate 3 is, for example, substantially the same as a diameter of the substrate W or slightly larger than the diameter of the substrate W. The shielding plate 3 is disposed such that a lower surface of the shielding plate 3 is horizontal. Further, the shielding plate 3 is disposed such that a central axis of the shielding plate 3 is positioned on a rotation axis of the spin chuck 2. The lower surface of the shielding plate 3 faces the upper surface of the substrate W held by the spin chuck 2. The shielding plate 3 is coupled, in a horizontal orientation, to a lower end of a support shaft 11. The shielding plate 3 and the support shaft 11 are raised and lowered in a vertical direction by a shielding plate lifting unit 12. The shielding plate lifting unit 12 raises and lowers the shielding plate 3 between a processing position (position shown in FIG. 1), at which the lower surface of the shielding plate 3 is proximal to the upper surface of the substrate W held by the spin chuck 2 and a retreat position (not shown) provided above the processing position.

The processing liquid supplying unit includes a central axis nozzle (nozzle) 17, a hydrophobizing agent line 18, guiding a liquid hydrophobizing agent from a hydrophobizing agent supply source to the central axis nozzle 17, a hydrophobizing agent valve 19, opening and closing the hydrophobizing agent line 18, a first flow control valve 20, adjusting a flow rate of a liquid inside the hydrophobizing agent line 18, a first dissolving agent line 21, guiding a liquid first dissolving agent from a supply source of the first dissolving agent to the central axis nozzle 17, a first dissolving agent valve 22, opening and closing the first dissolving agent line 21, a second flow control valve 23, adjusting a flow rate of a liquid inside the first dissolving agent line 21, a second dissolving agent line 24, guiding liquid IPA from an IPA supply source to the central axis nozzle 17, and a second dissolving agent valve 25, opening and closing the second dissolving agent line 24. Although not shown, each of the first flow control valve 20 and the second flow control valve 23 includes a valve body, with a valve seat provided in its interior, a valve element, opening and closing the valve seat, and an actuator, moving the valve element between an open position and a closed position.

The central axis nozzle 17 is disposed along the central axis of the shielding plate 3. The central axis nozzle 17 extends up and down in an interior of the support shaft 11. The central axis nozzle 17 is raised and lowered together with the shielding plate 3 and the support shaft 11.

A processing liquid supplied to the central axis nozzle 17 is discharged downward from a discharge port 17a provided at a lower end of the central axis nozzle 17. And, as shown in FIG. 1, the processing liquid discharged from the central axis nozzle 17 passes through a penetrating hole (not shown), penetrating up and down through a central portion of the shielding plate 3, and is discharged downward from a lower surface central portion of the shielding plate 3. The processing liquid is thereby supplied to the central portion of the upper surface of the substrate W held by the spin chuck 2.

By opening the hydrophobizing agent valve 19 while closing the first dissolving agent valve 22 and the second dissolving agent valve 25, the hydrophobizing agent is discharged from the discharge port 17a of the central axis nozzle 17. Also, by opening the first dissolving agent valve 22 while closing the hydrophobizing agent valve 19 and the second dissolving agent valve 25, the first dissolving agent is discharged from the discharge port 17a of the central axis nozzle 17. Also, by opening the second dissolving agent valve 25 while closing the hydrophobizing agent valve 19 and the first dissolving agent valve 22, the second dissolving agent is discharged from the discharge port 17a of the central axis nozzle 17.

A hydrophobizing agent supplying unit 52 includes the central axis nozzle 17, the hydrophobizing agent line 18, the hydrophobizing agent valve 19, and the first flow control valve 20.

The hydrophobizing agent is a metal hydrophobizing agent that hydrophobizes a metal. The hydrophobizing agent is a hydrophobizing agent with a high coordinating property. That is, the hydrophobizing agent is a dissolving agent that hydrophobizes a metal mainly by coordination bonds. The hydrophobizing agent includes, for example, at least one of an amine, having a hydrophobic group, or an organosilicon compound. The hydrophobizing agent may be a silicon hydrophobizing agent or a metal hydrophobizing agent.

A silicon hydrophobizing agent is a hydrophobizing agent that hydrophobizes silicon (Si) itself or a compound that contains silicon. The silicon hydrophobizing agent is, for example, a silane coupling agent. The silane coupling agent includes, for example, at least one of HMDS (hexamethyldisilazane), TMS (tetramethylsilane), fluorinated alkylchlorosilane, alkyldisilazane, and a non-chloro hydrophobizing agent. The non-chloro hydrophobizing agent includes, for example, at least one of dimethylsilyldimethylamine, dimethylsilyldiethylamine, hexamethyldisilazane, tetramethyldisilazane, bis(dimethylamino)dimethylsilane, N,N-dimethylaminotrimethylsilane, N-(trimethylsilyl)dimethylamine, and an organosilane compound.

The metal hydrophobizing agent is, for example, a dissolving agent having a high coordinating property and hydrophobizes a metal mainly by coordination bonds. The hydrophobizing agent includes, for example, at least one of an amine, having a hydrophobic group, or an organosilicon compound.

The hydrophobizing agent has the first dissolving agent as a solvent and has a fixed concentration. The hydrophobizing agent supply source holds the hydrophobizing agent of the fixed concentration by mixing a stock solution of the hydrophobizing agent (100% hydrophobizing agent) and the first dissolving agent at a fixed proportion.

A first dissolving agent supplying unit 53 includes the central axis nozzle 17, the first dissolving agent line 21, the first dissolving agent valve 22, and the second flow control valve 23. The first dissolving agent is a dissolving agent that does not contain a hydroxyl group. That is, the first dissolving agent is a dissolving agent constituted of a compound that does not contain a hydroxyl group. The first dissolving agent is capable of dissolving the hydrophobizing agent. Preferably the first dissolving agent does not contain water and is lower in surface tension than water. The first dissolving agent is a ketone dissolving agent or an ether dissolving agent. PGMEA (propylene glycol monomethyl ether acetate) and acetone can be cited as specific examples of the first dissolving agent. The ketone or ether dissolving agent is high in solubility of the stock solution of the hydrophobizing agent and when the stock solution of the hydrophobizing agent is mixed with the ketone or ether dissolving agent, the hydrophobizing agent disperses sufficiently in the ketone or ether dissolving agent.

A second dissolving agent supplying unit 54 includes the central axis nozzle 17, the second dissolving agent line 25, and the second dissolving agent valve 25. The second dissolving agent is a dissolving agent that is lower in surface tension than water. The second dissolving agent may contain water. The second dissolving agent is higher in solubility in water (that is, water solubility) than the first dissolving agent. The first dissolving agent is capable of dissolving the second dissolving agent. An alcohol and a mixed liquid of a fluorine-based dissolving agent and an alcohol can be cited as specific examples of the second dissolving agent. The alcohol includes, for example, at least one of methyl alcohol, ethanol, propyl alcohol, and IPA. The fluorine-based dissolving agent includes, for example, at least one of HFE (hydrofluoroether) and HFC (hydrofluorocarbon). In the following description, an example where the second dissolving agent is IPA shall be taken up as an example.

Figure 2:
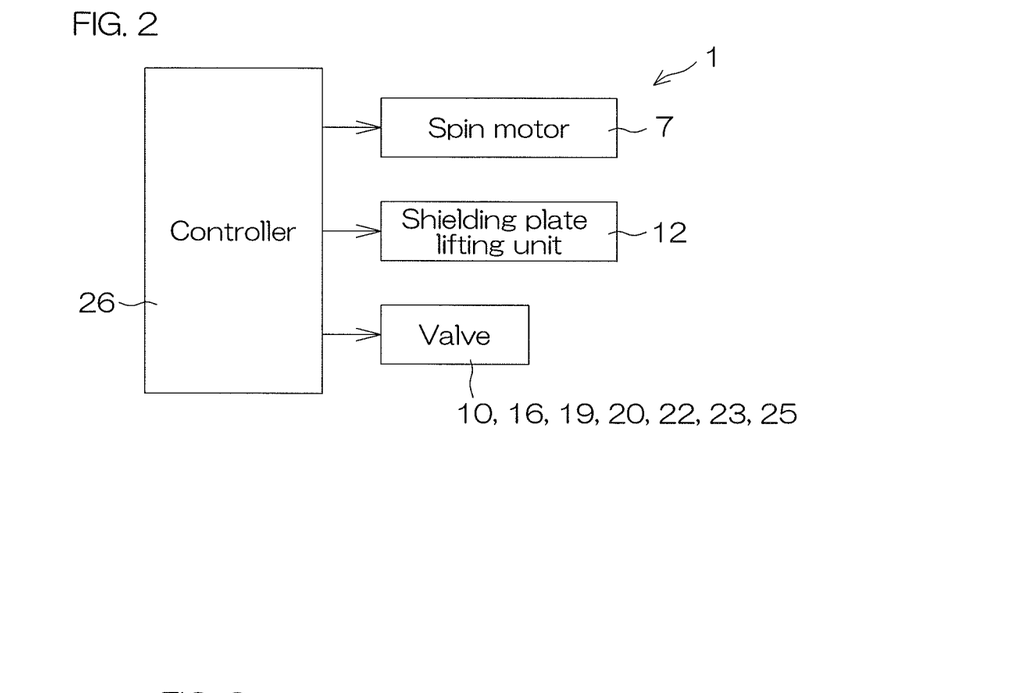
FIG. 2 is a block diagram for describing an electrical configuration of a main portion of the substrate processing apparatus.

FIG. 2 is a block diagram for describing an electrical configuration of the substrate processing apparatus 1.

The substrate processing apparatus 1 includes a controller 26. The controller 26 has a computing unit, such as CPU, etc., a storage unit, such as a fixed memory device, a hard disk drive, etc., and an input/output unit. A program executed by the computing unit is stored in the storage unit.

The spin motor 7, the shielding plate lifting unit 12, etc., are connected as control objects to the controller 26. Also, the controller 26 controls operations of the spin motor 7, the shielding plate lifting unit 12, etc., in accordance with a predetermined program. Also, the controller 26 opens and closed the rinse liquid valve 10, the chemical liquid valve 16, the hydrophobizing agent valve 19, the first dissolving agent valve 22, the second dissolving agent valve 25, etc., in accordance with the predetermined program. Also, the controller 26 adjusts opening degrees of the first flow control valve 20 and the second flow control valve 23, etc., in accordance with the predetermined program.

In the following, a case of processing the substrate W having patterns formed on a front surface, which is a device forming surface, shall be described.

Figure 3:
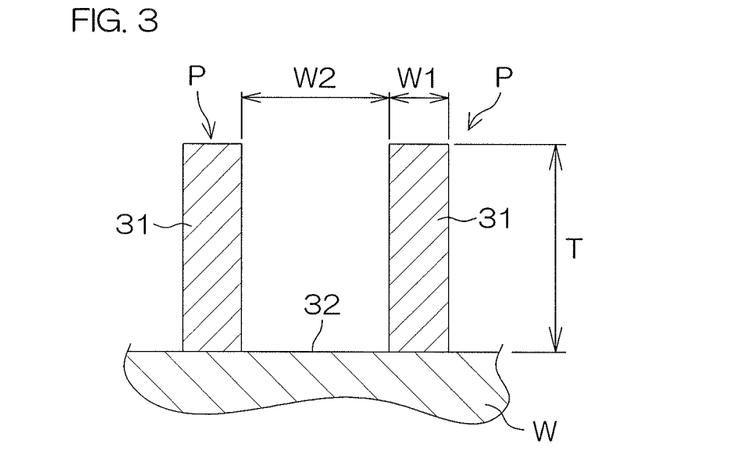
FIG. 3 is a sectional view showing in enlarged manner a front surface of a substrate that is a processing object of the substrate processing apparatus.

FIG. 3 is a sectional view showing in enlarged manner the front surface of the substrate W that is a processing object of the substrate processing apparatus 1. The substrate W that is the processing object is, for example, a silicon wafer and the patterns P are formed on the front surface (upper surface 32) that is its pattern forming surface. The patterns P are, for example, fine patterns. As shown in FIG. 3, the patterns P may be such that structures 31 having projecting shapes (columnar shapes) are disposed in a matrix. In this case, a line width W1 of each structure 31 is set, for example, to approximately 10 nm to 45 nm and gaps W2 of the patterns P are respectively set, for example, to approximately 10 nm to several μm. A film thickness T of each pattern P is, for example, approximately 1 μm. Also, for example, with each pattern P, an aspect ratio (ratio of the film thickness T with respect to the line width W1) may, for example, be approximately 5 to 500 (and is typically approximately 5 to 50).

Also, the patterns P may be such that linear patterns, formed by fine trenches, are arranged in repetition. Also, the patterns P may be formed by providing a plurality of fine holes (voids) or pores in a thin film.

The patterns P include, for example, an insulating film. Also, the patterns P may include a conductor film. More specifically, the patterns P are formed of a laminated film, in which a plurality of films are laminated, and may further include an insulating film and a conductor film. The patterns P may be a pattern constituted of a single layer film. The insulating film may be silicon oxide film (SiO2 film) or a silicon nitride film (SiN film). Also, the conductor film may be an amorphous silicon film, with an impurity introduced to achieve low resistance, or may be a metal film (for example, a metal wiring film).

Also, the pattern P may be a hydrophilic film. A TEOS film (a type of silicon oxide film) can be cited as an example of the hydrophilic film.

Figure 4:
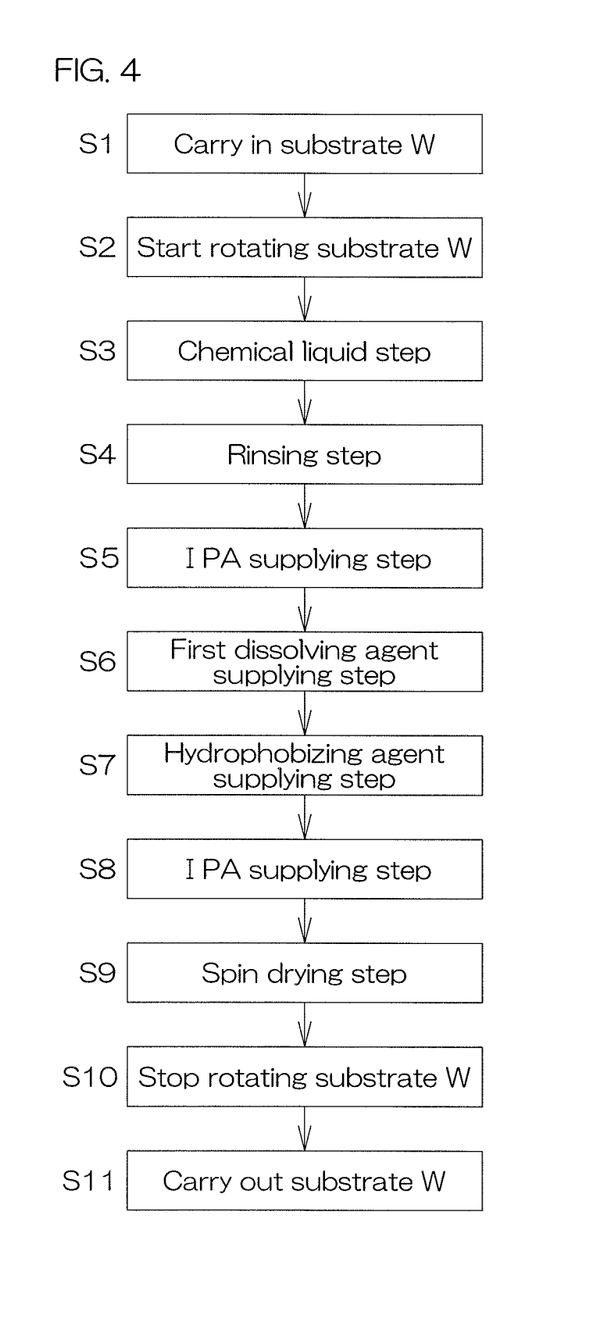
FIG. 4 is a flow diagram for describing an example of substrate processing performed by the substrate processing apparatus.

FIG. 4 is a flow diagram for describing an example of substrate processing performed by the substrate processing apparatus 1.

A first substrate processing example shall be described with reference to FIG. 1 to FIG. 4. FIG. 5 to FIG. 9 shall be referenced where appropriate.

By an unillustrated transfer robot, an unprocessed substrate W is transferred and carried into a chamber and delivered onto the spin chuck 2, housed inside the chamber, in a state where the front surface, which is the device forming surface, is faced upward for example, and the substrate W is held by the spin chuck 2 (S1 of FIG. 4: substrate carry-in). Prior to the carry-in of the substrate W, the shielding plate 3 is retreated to the retreat position.

Thereafter, the controller 26 starts rotation of the substrate W by the spin motor 7 (step S2 of FIG. 4: rotating step). The substrate W is raised to a predetermined liquid processing speed (within a range of 300 to 1500 rpm and, for example, of 500 rpm) and maintained at the liquid processing speed.

When the rotation of the substrate W reaches the liquid processing speed, the controller 26 executes a chemical liquid step (step S3 of FIG. 4) of supplying the chemical liquid to the front surface of the substrate W. Specifically, the controller 26 opens the chemical liquid valve 16. The chemical liquid is thereby supplied from the chemical liquid nozzle 14 toward the upper surface of the substrate W in the rotating state. The supplied chemical liquid is spread across the entire upper surface of the substrate W by a centrifugal force and chemical liquid processing, using the chemical liquid, is applied to the substrate W. When a predetermined period elapses from the start of discharge of the chemical liquid, the controller 26 closes the chemical liquid valve 16 to stop the discharge of the chemical liquid from the chemical liquid nozzle 14. The chemical liquid step (S3) is thereby ended.

Next, the controller 26 executes a rinsing step for replacing the chemical liquid on the substrate W with the rinse liquid and removing the chemical liquid from the substrate W (step S4 of FIG. 4). Specifically, the controller 26 opens the rinse liquid valve 10. The rinse liquid is thereby discharged from the rinse liquid nozzle 8 toward the upper surface of the substrate W in the rotating state. The discharged rinse liquid is spread across the entire upper surface of the substrate W by the centrifugal force. The chemical liquid attached to the substrate W is rinsed off by the rinse liquid.

Figure 5:
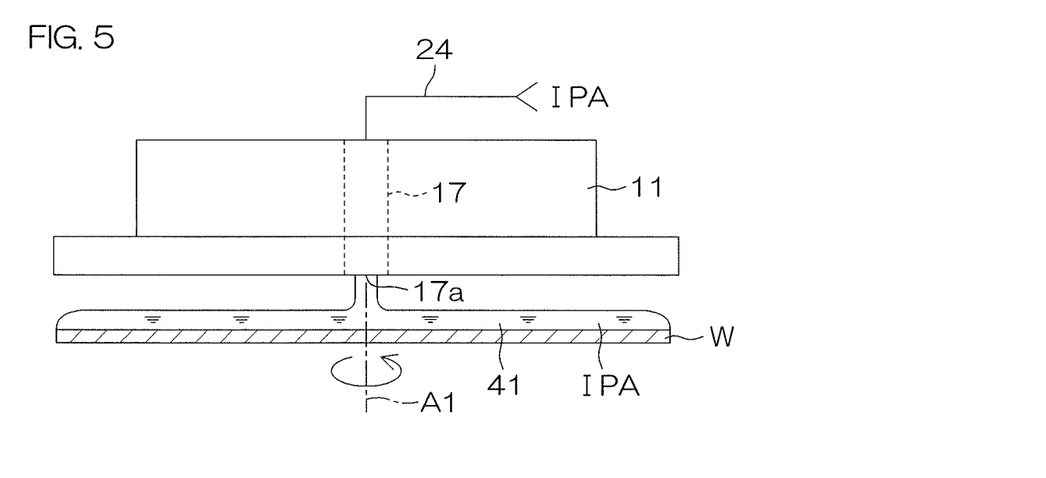
FIG. 5 is a schematic view, viewed horizontally, of the substrate when an IPA supplying process is being performed.

Next, an IPA supplying step (second dissolving agent supplying step) of supplying IPA to the upper surface of the substrate W (step S5 of FIG. 4) is performed. Specifically, the controller 26 makes the shielding plate 3 be lowered and positioned at the processing position and further, while making the substrate W be rotated by the spin chuck 2, opens the second dissolving agent valve 25 to make IPA be discharged from the central axis nozzle 17 toward the central portion of the upper surface of the substrate W. The IPA that lands on the central portion of the upper surface of the substrate receives the centrifugal force due to the rotation of the substrate W and flows toward the peripheral edge portion of the upper surface of the substrate. A liquid film 41 of the IPA that covers the entire upper surface of the substrate W is thereby formed on the upper surface of the substrate W as shown in FIG. 5 (coverage of the upper surface of the substrate W by the IPA is achieved; second dissolving agent liquid film forming step). The rinse liquid held on the substrate W is thereby replaced by the IPA. When a predetermined period elapses from the start of discharge of the IPA, the controller 26 closes the second dissolving agent valve 25 to stop the discharge of the IPA. By the IPA supplying step being performed, water is removed from the substrate W.

Figure 6:
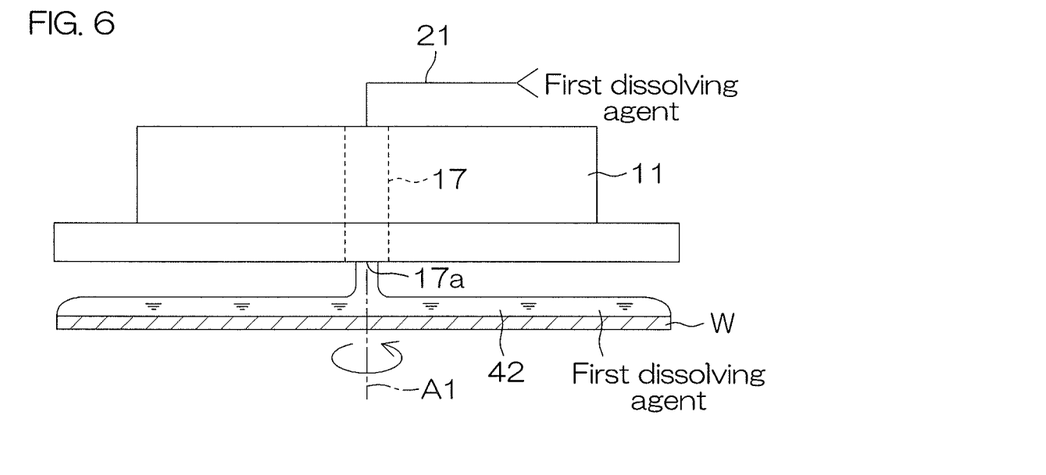
FIG. 6 is a schematic view, viewed horizontally, of the substrate when a first dissolving agent supplying process is being performed.

Next, a first dissolving agent supplying step of supplying the first dissolving agent (for example, PGMEA, etc.) to the upper surface of the substrate W is performed (step S6 of FIG. 4). Specifically, the controller 26 makes the shielding plate 3 be positioned at the processing position and further, while making the substrate W be rotated by the spin chuck 2, opens the first dissolving agent valve 22 to make the first dissolving agent be discharged from the discharge port 17a of the central axis nozzle 17 toward the central portion of the upper surface of the substrate W. The first dissolving agent that lands on the central portion of the upper surface of the substrate receives the centrifugal force due to the rotation of the substrate W and flows toward the peripheral edge portion of the upper surface of the substrate. The IPA contained in the liquid film 41 held on the substrate W is then replaced by the first dissolving agent (first dissolving agent supplying step). A liquid film 42 of the first dissolving agent that covers the entire upper surface of the substrate W is thereby formed on the upper surface of the substrate W as shown in FIG. 6 (coverage of the upper surface of the substrate W by the first dissolving agent is achieved; first dissolving agent liquid film forming step). Then, when a predetermined period elapses from the start of discharge of the first dissolving so, the controller 26 closes the first dissolving agent valve 22 to stop the discharge of the first dissolving agent.

Next, a hydrophobizing agent supplying step of supplying the liquid hydrophobizing agent to the upper surface of the substrate W is performed (step S7 of FIG. 4). Specifically, the controller 26 makes the shielding plate 3 be positioned at the processing position and further, while making the substrate W be rotated by the spin chuck 2, opens the hydrophobizing agent valve 19 to make the hydrophobizing agent (that is, the hydrophobizing agent having the first dissolving agent as the solvent) be discharged from the discharge port 17a of the central axis nozzle 17 toward the central portion of the upper surface of the substrate W.

Figure 7:
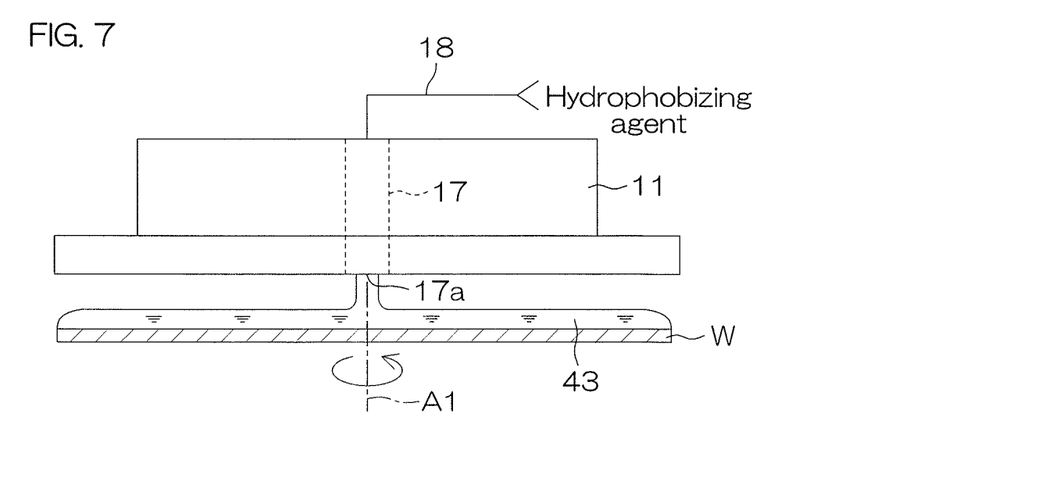
FIG. 7 is a schematic view, viewed horizontally, of the substrate when a hydrophobizing agent supplying process is being performed.

The hydrophobizing agent that lands on the central portion of the upper surface of the substrate W receives the centrifugal force due to the rotation of the substrate W and flows toward the peripheral edge portion of the upper surface of the substrate. The first dissolving agent contained in the liquid film 42 held on the substrate W is then replaced by the hydrophobizing agent (hydrophobizing agent supplying step). A liquid film 43 of the hydrophobizing agent that covers the entire upper surface of the substrate W is thereby formed on the upper surface of the substrate W as shown in FIG. 7 (coverage of the upper surface of the substrate W by the hydrophobizing agent is achieved; hydrophobizing agent liquid film forming step).

The hydrophobizing agent that contains the first dissolving agent is high in affinity with and easily replaces the same first dissolving agent. On the other hand, depending on the type of the first dissolving agent, the hydrophobizing agent containing the first dissolving agent may be low in affinity with and have difficulty replacing the IPA.

PGMEA and IPA are, in the first place, low in affinity. In addition, a difference in viscosity between the two also presents a problem. Specifically, when PGMEA is used as the hydrophobizing agent, its viscosity is, for example, approximately 1 cp. On the other hand, the viscosity of IPA is approximately 2.4 cp. Time is required to replace the IPA liquid film 41 of high viscosity with the PGMEA of low viscosity. Therefore, in comparison to a case of replacing the IPA with the hydrophobizing agent containing the first dissolving agent, replacement can be achieved more smoothly by replacing the same first dissolving agent with the hydrophobizing agent containing the first dissolving agent. Therefore, by interposing the first dissolving agent supplying step (S6) between the IPA supplying step (S5) and the hydrophobizing agent supplying step (S7), the liquid film 43 of the hydrophobizing agent that covers the entire upper surface of the substrate W can be formed in a short time (that is, the time required to achieve coverage of the entire upper surface of the substrate W by the hydrophobizing agent can be shortened) in comparison to a case of transitioning directly from the IPA supplying step (S5) to the hydrophobizing agent supplying step (S7). It is desired that a consumption amount of the hydrophobizing agent be reduced as much as possible. Reduction of the consumption amount of the hydrophobizing agent (especially the stock solution of the hydrophobizing agent), which is extremely expensive, can be achieved because the time required to achieve coverage of the entire upper surface of the substrate W by the hydrophobizing agent can be shortened.

By the liquid film 43 of the hydrophobizing agent being formed on the upper surface of the substrate W, the hydrophobizing agent enters deep into the patterns P and the upper surface of the substrate W is hydrophobized (hydrophobization processing).

In the hydrophobizing agent supplying step (S7), a continuous flow of the hydrophobizing agent continues to be discharged from the discharge port 17a of the central axis nozzle 17 toward the upper surface of the substrate W with a Reynolds number at the discharge port 17a being of a predetermined value not more than 1500. Specifically, prior to the discharge of the hydrophobizing agent from the discharge port 17a, the controller 26 adjusts the opening degree of the first flow control valve 20 such that the Reynolds number at the discharge port 17a would be of the predetermined number not more than 1500.

Figure 8:
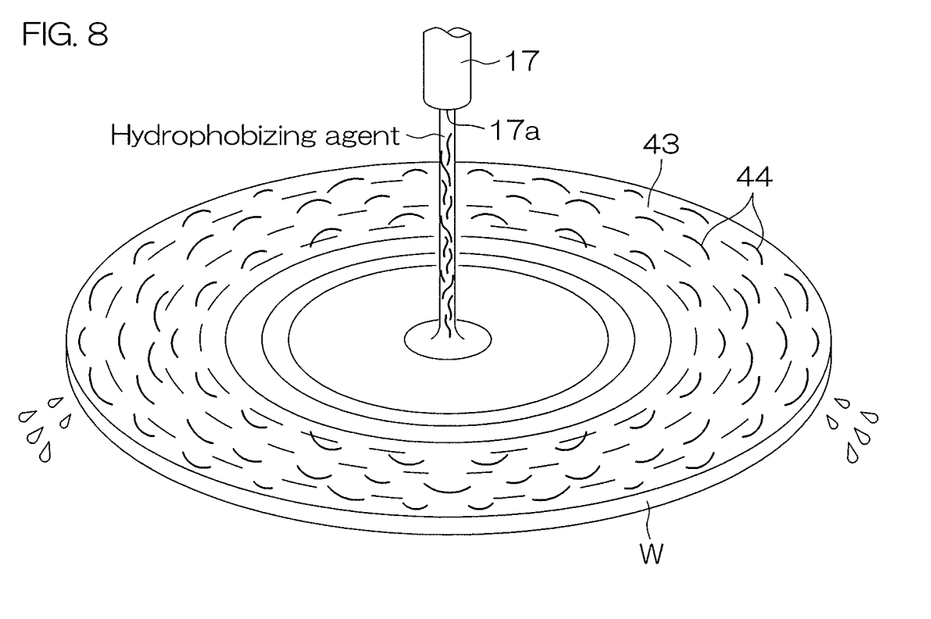
FIG. 8 is a perspective view of a state of the substrate when a Reynolds number at a discharge port exceeds 1500 in the hydrophobizing agent supplying step.

When the Reynolds number at the discharge port 17a exceeds 1500 (that is, when a discharge flow rate from the discharge port 17a becomes large), the hydrophobizing agent of continuous flow form discharged from the discharge port 17a becomes turbulent as shown in FIG. 8. When the discharge becomes turbulent, vibration is generated at the upper surface of the substrate W due to an impact force when the hydrophobizing agent lands on the upper surface of the substrate W and this vibration is transmitted to the hydrophobizing agent (that is, the liquid film 43 of the hydrophobizing agent) held on the upper surface of the substrate W. Consequently, rippling 44 occurs in the hydrophobizing agent held on the upper surface of the substrate W as shown in FIG. 8.

When the rippling 44 occurs in the hydrophobizing agent (that is, the liquid film 43 of the hydrophobizing agent) held on the upper surface of the substrate W, a contact area of the hydrophobizing agent and moisture in the surrounding atmosphere increases. The hydrophobizing agent reacts readily with water and will also react with the moisture in the atmosphere. By reaction with the moisture in the atmosphere, a hydrophobizing ability of the hydrophobizing agent held on the upper surface of the substrate W decreases. Consequently, there are cases where the upper surface of the substrate W cannot be hydrophobization processed satisfactorily.

Further, particles may form due to the reaction of the hydrophobizing agent and the moisture. It is desirable that the contact area of the hydrophobizing agent and the atmosphere be small from this standpoint as well.

Figure 9:
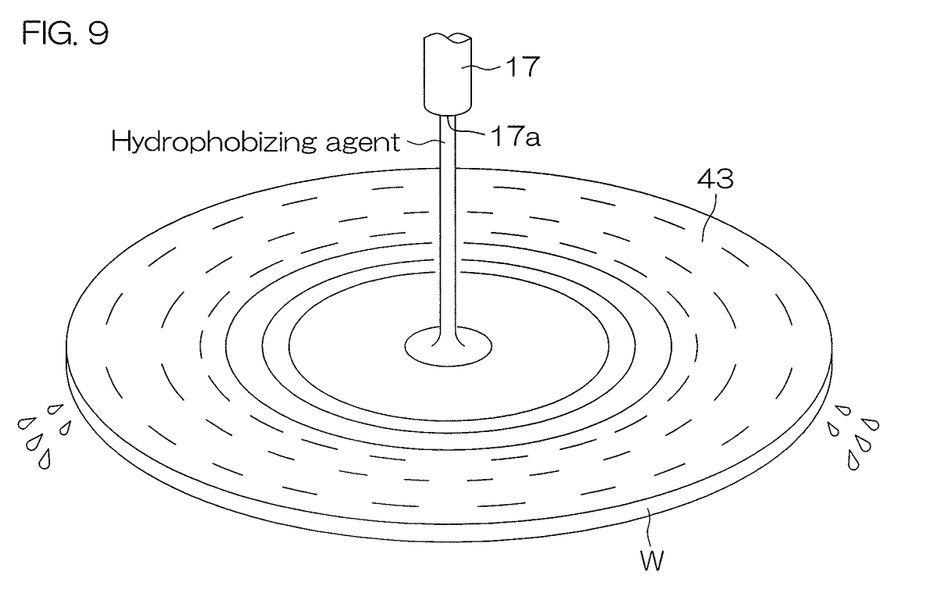
FIG. 9 is a perspective view of a state of the substrate when the Reynolds number at the discharge port is not more 1500 in the hydrophobizing agent supplying step.

On the other hand, in the hydrophobizing agent supplying step (S7), the Reynolds number at the discharge port 17a is not more than 1500 and therefore as shown in FIG. 9, the hydrophobizing agent of continuous flow form discharged from the discharge port 17a takes on a columnar form without becoming turbulent. That is, turbulence of discharge does not occur or is low even if it occurs. Turbulence of discharge of the hydrophobizing agent supplied to the upper surface of the substrate W can thus be suppressed or prevented. Occurrence of the rippling 44 (see FIG. 8) of the hydrophobizing agent supplied to the upper surface (held on the upper surface) of the substrate W can thereby be suppressed or prevented and consequently, the contact area of the hydrophobizing agent and the moisture in the atmosphere can be suppressed to be small. The upper surface of the substrate W can thus be hydrophobization processed satisfactorily and the forming of particles can be suppressed or prevented.

Further, in the hydrophobizing agent supplying step (S7), it is further preferable for the Reynolds number at the discharge port 17a to be of a predetermined value not less than 450 and not more than 1500. The Reynolds number at the discharge port 17a is not less than 450 and therefore the discharge flow rate of the hydrophobizing agent from the discharge port 17a is sufficiently large (is by no means small). Time from the start of discharge of the hydrophobizing agent to coverage can thus be shortened.

Conversely, if the Reynolds number at the discharge port 17a in the hydrophobizing agent supplying step (S7) is less than 450, the discharge flow rate of the hydrophobizing agent from the discharge port 17a is too small and consequently, coverage of the entire upper surface of the substrate W cannot be achieved or even if coverage can be achieved, an extremely long time would be required for the coverage and throughput may worsen. Further, even if the discharge flow rate is small, the consumption amount of the hydrophobizing agent for the entire processing may even increase as a result of extension of discharge period due to coverage taking an extremely long time to achieve. When the hydrophobization processing is performed for a predetermined time, the controller 26 closes the hydrophobizing agent valve 19 to stop the discharge of the hydrophobizing agent from the central axis nozzle 17.

Next, an IPA supplying step of supplying IPA as a drying agent to the upper surface of the substrate W is performed (step S8 of FIG. 4). Specifically, the controller 26 makes the shielding plate 3 be lowered and positioned at the processing position and further, while making the substrate W be rotated by the spin chuck 2, opens the second dissolving agent valve 25 to make IPA be discharged from the central axis nozzle 17 toward the central portion of the upper surface of the substrate W. The IPA discharged from the central axis nozzle 17 is thereby supplied to the entire upper surface of the substrate W. A large portion of the hydrophobizing agent held on the substrate W is thus rinsed off by the IPA. When a predetermined period elapses from the start of discharge of the IPA, the controller 26 closes the second dissolving agent valve 25 to stop the discharge of the IPA.

Next, the controller 26 executes a spin drying step (step S9 of FIG. 4). Specifically, the controller 26 accelerates the substrate W to a predetermined spin drying speed (of, for example, several thousand rpm) that is greater than the liquid processing speed and makes the substrate W rotate at the spin drying speed. A large centrifugal force is thereby applied to the liquid on the substrate W and the liquid attached to the substrate W is spun off to a periphery of the substrate W. The liquid is thereby removed from the substrate W and the substrate W dries.

When a predetermined period elapses from the start of high-speed rotation of the substrate W, the controller 26 controls the spin motor 7 to make the rotation of the substrate W by the spin chuck 2 stop (step S10 of FIG. 4).

Thereafter, the processed substrate W is carried out from spin chuck 2 by the transfer robot (step S11 of FIG. 4).

By the above, with the present preferred embodiment, in the hydrophobizing agent supplying step (S7), the continuous flow of the hydrophobizing agent is discharged from the discharge port 17a of the central axis nozzle 17 toward the upper surface of the substrate W with the Reynolds number at the discharge port 17a being not more than 1500. If the Reynolds number is not more than 1500, the hydrophobizing agent, containing the first dissolving agent and being of the continuous flow form discharged from the discharge port 17a, takes on the columnar form without becoming turbulent. That is, turbulence of discharge does not occur or is low even if it occurs. Turbulence of discharge of the hydrophobizing agent supplied to the upper surface of the substrate W can thus be suppressed or prevented. Occurrence of the rippling of the hydrophobizing agent supplied to the upper surface (held on the upper surface) of the substrate W can thereby be suppressed or prevented and consequently, the contact area of the hydrophobizing agent and the moisture in the atmosphere can be suppressed to be small. The upper surface of the substrate W can thus be hydrophobization processed satisfactorily.

Also, after the rinse liquid is supplied to the upper surface of the substrate W, IPA is supplied to the upper surface of the substrate W and the liquid film 41 of IPA covering the entire upper surface of the substrate W is formed on the upper surface of the substrate W. Also, after the IPA is supplied to the upper surface of the substrate W, the first dissolving agent is supplied to the upper surface of the substrate W. The liquid contained in the liquid film 41 of IPA is thereby replaced by the first dissolving agent and the liquid film 42 of the first dissolving agent covering the entire upper surface of the substrate W is formed. And, after the first dissolving agent is supplied, the hydrophobizing agent containing the first dissolving agent is supplied to the upper surface of the substrate W. The liquid contained in the liquid film 42 of the first dissolving agent is thereby replaced by the hydrophobizing agent containing the same first dissolving agent and the liquid film 43 of the hydrophobizing agent covering the entire upper surface of the substrate W is formed.

The hydrophobizing agent containing the first dissolving agent is high in affinity with and easily replaces the same first dissolving agent. Therefore, by interposing the first dissolving agent supplying step (S6) between the IPA supplying step (S5) and the hydrophobizing agent supplying step (S7), the liquid film 43 of the hydrophobizing agent that covers the entire upper surface of the substrate W can be formed in a short time (that is, the time required to achieve coverage of the entire upper surface of the substrate W by the hydrophobizing agent can be shortened) in comparison to the case of transitioning directly from the IPA supplying step (S5) to the hydrophobizing agent supplying step (S7).

It is desired that the consumption amount of the hydrophobizing agent be reduced as much as possible. Reduction of the consumption amount of the hydrophobizing agent (especially the stock solution of the hydrophobizing agent), which is extremely expensive, can be achieved because the time required to achieve coverage of the entire upper surface of the substrate W by the hydrophobizing agent can be shortened.

<First Test>

Figure 10:
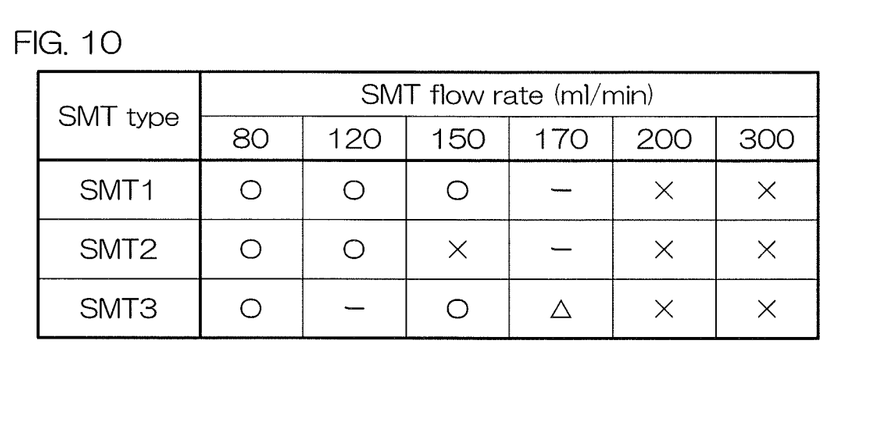
FIG. 10 is a diagram showing results of a first test.
Figure 11:
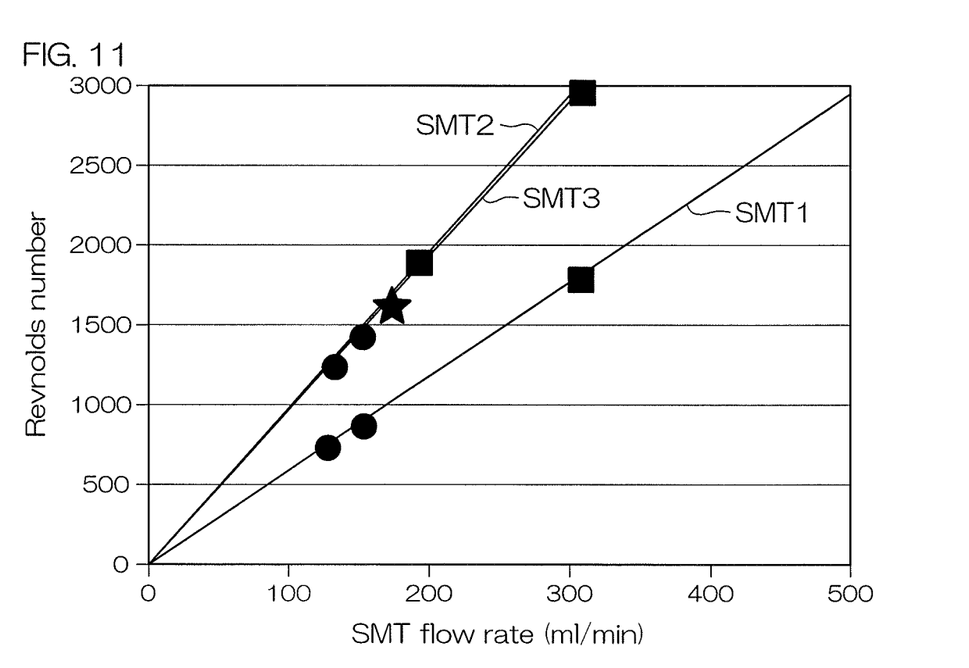
FIG. 11 is a diagram showing results of the first test.

Next, a first test shall be described. In the first test, a degree of stability of discharge when a hydrophobizing agent (SMT) is discharged from the discharge port 17a in the substrate processing apparatus 1 was examined. The types of the hydrophobizing agent discharged from the discharge port 17a were differed as follows: SMT1 (OSRA-A004), SMT2 (OSRA-A7801), and SMT3 (PK-HP-S). Also, the discharge flow rate of the hydrophobizing agent from the discharge port 17a was varied. The results are shown in FIG. 10 and FIG. 11. In FIG. 10, a case where discharge is stable is indicated by "○," a case where discharge is somewhat turbulent is indicated by "Δ," and a case where discharge is highly turbulent is indicated by "x." FIG. 11 shows a relationship of the discharge flow rate of the hydrophobizing agent and the Reynolds number at the discharge port 17a, with a case where discharge is stable being indicated by "●," a case where discharge is somewhat turbulent being indicated by "★," and a case where discharge is highly turbulent being indicated by "■."

From the results shown in FIG. 11, it can be understood that if the Reynolds number at the discharge port 17a is not more than 1500, the hydrophobizing agent, containing the first dissolving agent and being of the continuous flow form discharged from the discharge port 17a, takes on the columnar form without becoming turbulent.

<Second Test>

Next, a second test shall be described. In the second test, the series of processing shown in FIG. 4 was performed with the substrate processing apparatus 1. In the hydrophobizing agent supplying step (S7 of FIG. 4), the discharge flow rate of the hydrophobizing agent was varied at 120 ml/min, 150 ml/min, and 300 ml/min and the rotation speed of the substrate W was varied at 300 rpm, 500 rpm, and 800 rpm. The substrate W was bare silicon, PGMEA was used as the first dissolving agent, and OSRA-A004 was used as the stock solution of the hydrophobizing agent. After applying such processing, contact angles at a plurality of locations of the front surface of the substrate W were examined and the average value thereof was determined. The results are shown in FIG. 12.

Figure 12:
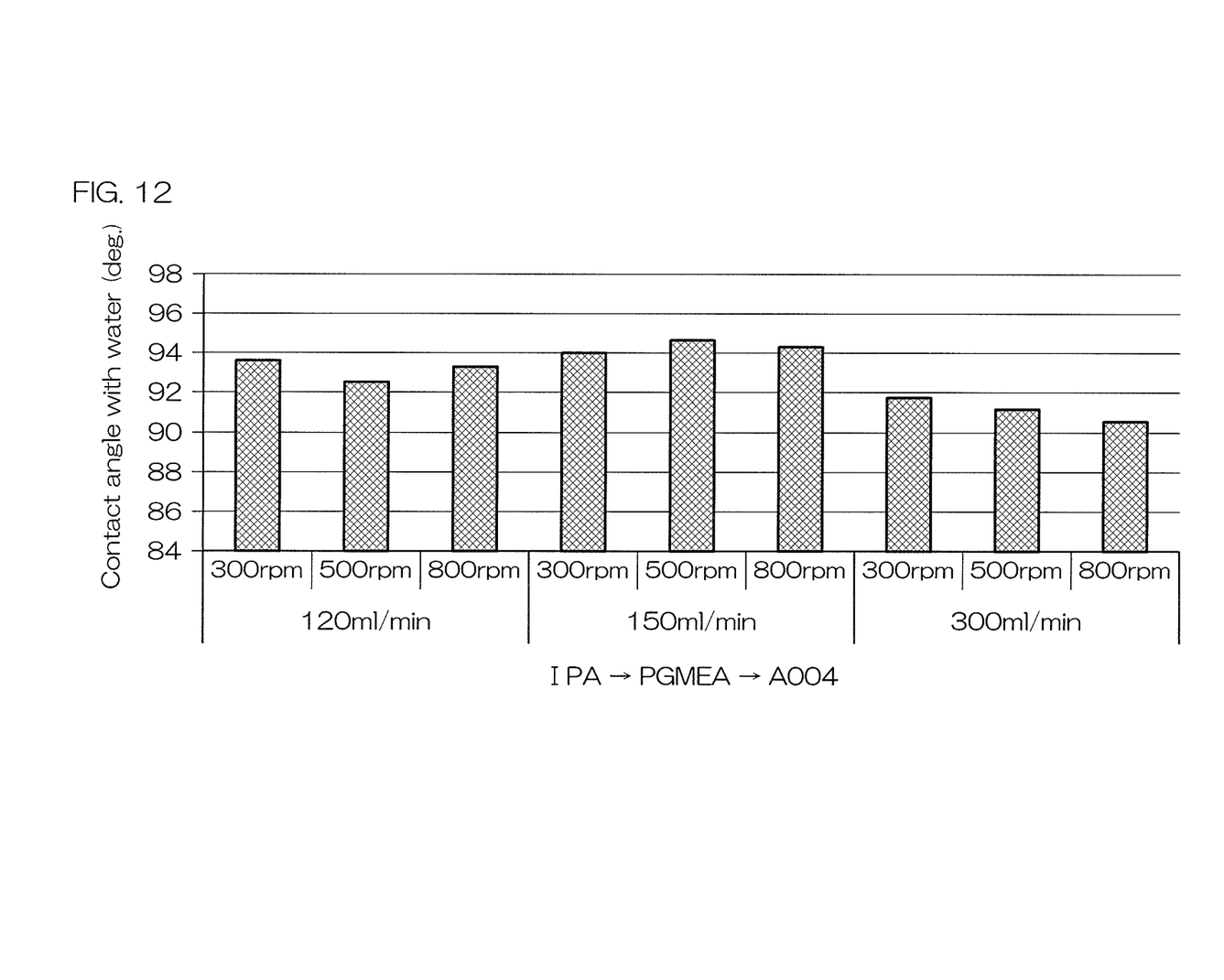
FIG. 12 is a diagram showing results of a second test.

The results shown in FIG. 12 show that when the discharge flow rate was 120 ml/min (the Reynolds number was 710) and 150 ml/min (the Reynolds number was 888), the contact angle was not less than 92°. On the other hand, when the discharge flow rate was 300 ml/min (the Reynolds number is 1775), the contact angle was less than 92. It is surmised that when the discharge flow rate was 300 ml/min, the rippling 44 (see FIG. 8) occurred in the hydrophobizing agent held on the upper surface of the substrate W as a result of the discharge becoming turbulent and the hydrophobizing ability of the hydrophobizing agent decreased due to the hydrophobizing agent reacting with the moisture in the atmosphere and consequently the upper surface of the substrate W could not be hydrophobization processed satisfactorily.

<Third Test>

Next, a third test shall be described.

Example

In the third test, as an example, the series of processing shown in FIG. 4 was performed with the substrate processing apparatus 1. The discharge flow rate of the hydrophobizing agent was set to 120 ml/min and the rotation speed of the substrate W was set to 300 rpm. The substrate W was bare silicon, PGMEA was used as the first dissolving agent, and OSRA-A004 was used as the stock solution of the hydrophobizing agent.

Comparative Example

In the third test, as a comparative example, a processing example, where the first dissolving agent supplying step (S6 of FIG. 4) was omitted from the processing shown in FIG. 4, was executed with the substrate processing apparatus 1. That is, direct transition from the IPA supplying step (S5 of FIG. 4) to the hydrophobizing agent supplying step (S7 of FIG. 4) was performed. The discharge flow rate of the hydrophobizing agent was set to 120 ml/min and the rotation speed of the substrate W was set to 300 rpm. The substrate W was bare silicon, PGMEA was used as the first dissolving agent, and OSRA-A004 was used as the stock solution of the hydrophobizing agent.

The spreading of the hydrophobizing agent on the upper surface of the substrate W was observed with the naked eye.

With the example, the liquid film 43 of the hydrophobizing agent spread while remaining circular in shape. Just approximately 1 second was required for complete coverage of the upper surface of the substrate W to be achieved.

Figure 13:
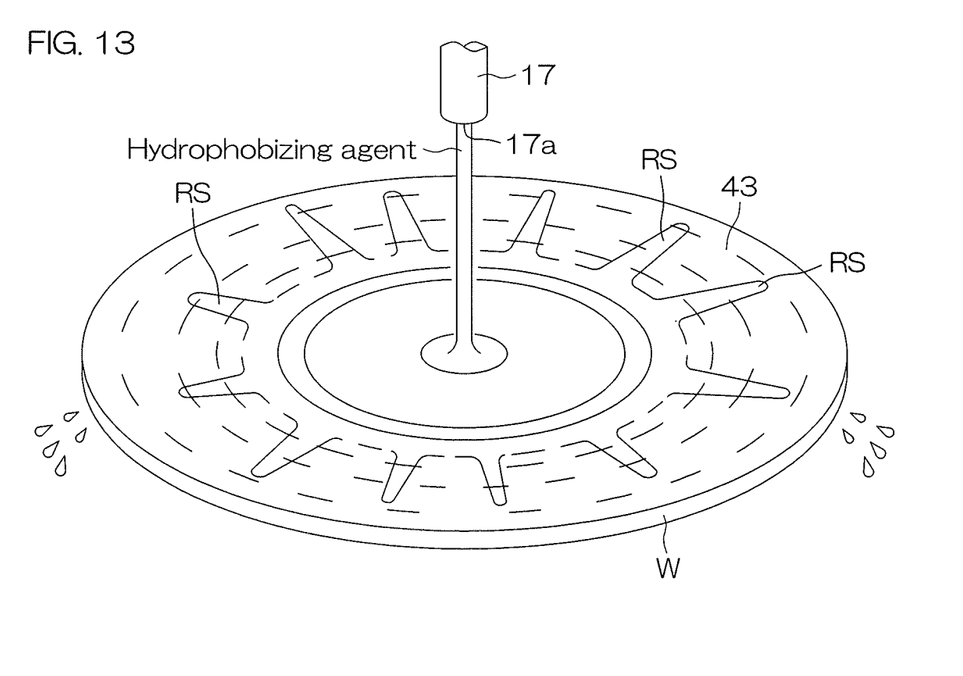
FIG. 13 is a perspective view of a state of a substrate in a hydrophobizing agent supplying step according to a comparative example.

With the comparative example, radial streaks RS were formed in the liquid film of the hydrophobizing agent as shown in FIG. 13. The streaks RS impeded the spreading of the liquid film 43 of the hydrophobizing agent and consequently, approximately 8 seconds were required for complete coverage of the upper surface of the substrate W by the hydrophobizing agent to be achieved.

From the results of the third test, it was found that by interposing the first dissolving agent supplying step (S6 of FIG. 4) between the IPA supplying step (S5 of FIG. 4) and the hydrophobizing agent supplying step (S7 of FIG. 4), the liquid film 43 of the hydrophobizing agent that covers the entire upper surface of the substrate W can be formed in a short time in comparison to the case of transitioning directly from the IPA supplying step (S5 of FIG. 4) to the hydrophobizing agent supplying step (S7 of FIG. 4).

Although a preferred embodiment of the present invention has been described above, the present invention may be implemented in yet other modes.

For example, although IPA was taken up as an example of the drying agent in the IPA supplying step (S5 of FIG. 4) in the description, an alcohol or a mixed liquid of a fluorine-based dissolving agent and an alcohol can be cited as the drying agent. The alcohol includes, for example, at least one of methyl alcohol, ethanol, propyl alcohol, and IPA. The fluorine-based dissolving agent includes, for example, at least one of HFE (hydrofluoroether) and HFC (hydrofluorocarbon).

Also, in the substrate processing example shown in FIG. 4, the first dissolving agent supplying step (S6 of FIG. 4) may be omitted and a direct transition from the IPA supplying step (S5 of FIG. 4) to the hydrophobizing agent supplying step (S7 of FIG. 4) may be performed.

Also, the IPA supplying step (S5 of FIG. 4) may be omitted.

Also, with the preferred embodiment described above, a case where the nozzle that discharges the hydrophobizing agent is the central axis nozzle 17 that moves integrally with the shielding plate 3 was described. However, the hydrophobizing agent may instead be arranged to be discharged from a nozzle provided separately of the shielding plate 3. In this case, a nozzle moving apparatus that moves the nozzle to move the liquid landing position of the chemical liquid hydrophobizing agent with respect to the upper surface of the substrate W between a central portion of the upper surface of the substrate W and a portion besides that (for example, a peripheral edge portion), may be included.

Also with the preferred embodiment described above, a case where the hydrophobizing agent and the first dissolving agent are discharged from a nozzle in common (the central axis nozzle 17) was described. However, the hydrophobizing agent and the first dissolving agent may instead be discharged respectively from dedicated nozzles.

Various modifications besides the above may be made within the scope stated in the claims.

Besides the features stated in the claims, the following features can be extracted from the present specification and the attached drawings. These features may be combined in any way with the features stated in the Means for Solving the Problem section.

A1: A rotating step of rotating a substrate, held in a horizontal orientation, around a vertical rotation axis passing through a central portion of an upper surface of the substrate, a rinse liquid supplying step of supplying a rinse liquid containing water to the upper surface of the substrate in parallel with the rotating step, a second dissolving agent liquid film forming step of supplying a second dissolving agent to the upper surface of the substrate to replace the rinse liquid held on the upper surface of the substrate with the second dissolving agent to form a liquid film of the second dissolving agent covering the entire upper surface of the substrate in parallel with the rotating step after the rinse liquid supplying step is performed, a first dissolving agent liquid film forming step of supplying a first dissolving agent to the upper surface of the substrate to replace the liquid contained in the liquid film of the second dissolving agent with the first dissolving agent, differing in type from the second dissolving agent, to form a liquid film of the first dissolving agent covering the entire upper surface of the substrate in parallel with the rotating step after the second dissolving agent liquid film forming step is performed, and a hydrophobizing agent liquid film forming step of supplying a hydrophobizing agent containing the first dissolving agent to the upper surface of the substrate to replace the liquid contained in the liquid film of the first dissolving agent with the hydrophobizing agent to form a liquid film of the hydrophobizing agent covering the entire upper surface of the substrate in parallel with the rotating step after the first dissolving agent liquid film forming step is performed are included.

According to the invention described in A1, after the rinse liquid is supplied to the upper surface of the substrate, the second dissolving agent is supplied to the upper surface of the substrate to form, on the upper surface of the substrate, the liquid film of the second dissolving agent that covers the entire upper surface. Also, after the second dissolving agent is supplied to the upper surface of the substrate, the first dissolving agent is supplied to the upper surface of the substrate. The liquid contained in the liquid film of the second dissolving agent is thereby replaced by the first dissolving agent and the liquid film of the first dissolving agent that covers the entire upper surface is formed. Then, after the supplying of the first dissolving agent is performed, the hydrophobizing agent containing the first dissolving agent is supplied to the upper surface of the substrate. The liquid contained in the liquid film of the first dissolving agent is thereby replaced by the hydrophobizing agent containing the same first dissolving agent and the liquid film of the hydrophobizing agent that covers the entire upper surface is formed.

The hydrophobizing agent containing the first dissolving agent is high in affinity with and easily replaces the same first dissolving agent. On the other hand, depending on the type of the first dissolving agent and the type of the second dissolving agent, the hydrophobizing agent containing the first dissolving agent may be low in affinity with and have difficulty replacing the second dissolving agent (replacement may be difficult due to a difference in viscosity between the hydrophobizing agent and the second dissolving agent). Therefore, in comparison to a case of replacing the second dissolving agent of different type with the hydrophobizing agent containing the first dissolving agent, replacement can be achieved more smoothly by replacing the same first dissolving agent with the hydrophobizing agent containing the first dissolving agent. A liquid film of the hydrophobizing agent covering the entire upper surface of the substrate can thus be formed in a short time.

Although a preferred embodiment of the present invention has been described in detail above, this is merely a specific example used to clarify the technical content of the present invention and the present invention should not be interpreted as being limited to this specific example and the scope of the present invention is limited only by the appended claims.

The present application corresponds to Japanese Patent Application No. 2017-108184 filed on May 31, 2017 in the Japan Patent Office, and the entire disclosure of this application is incorporated herein by reference.

What is claimed is:

1. A substrate processing method comprising:
    a rinse liquid supplying step of supplying a rinse liquid containing water to a major surface of a substrate;
    a rotating step of rotating the substrate around a rotation axis passing through a central portion of the major surface of the substrate; and
    a hydrophobizing agent supplying step of supplying a hydrophobizing agent containing a first dissolving agent to the major surface of the substrate to replace a liquid held on the major surface of the substrate with the hydrophobizing agent in parallel with the rotating step after the rinse liquid supplying step is performed; and
    wherein the hydrophobizing agent supplying step includes a hydrophobizing agent discharging step of discharging a continuous flow of the hydrophobizing agent from a discharge port of a nozzle toward the major surface of the substrate held by a substrate holding unit with a Reynolds number at the discharge port being not more than 1500 and not less than 450.

2. The substrate processing method according to claim 1, further comprising:
    a second dissolving agent supplying step of supplying a second dissolving agent, differing in type from the first dissolving agent, to the major surface of the substrate to replace a liquid held on the major surface of the substrate with the second dissolving agent at a point after the rinse liquid supplying step is performed and before the hydrophobizing agent supplying step is performed; and a first dissolving agent supplying step of supplying the first dissolving agent to the major surface of the substrate to replace a liquid held on the major surface of the substrate with the first dissolving agent in parallel with the rotating step at a point after the second dissolving agent supplying step is performed and before the hydrophobizing agent supplying step is performed.

* * * * *